(12) United States Patent
Van De Wal et al.

(10) Patent No.: US 10,095,123 B2
(45) Date of Patent: Oct. 9, 2018

(54) CONTROL SYSTEM, POSITIONING SYSTEM, LITHOGRAPHIC APPARATUS, CONTROL METHOD, DEVICE MANUFACTURING METHOD AND CONTROL PROGRAM

(71) Applicant: ASML Netherlands B.V., Veldhoven (NL)

(72) Inventors: Marinus Maria Johannes Van De Wal, Oirschot (NL); Wilhelmus Henricus Theodorus Maria Aangenent, Eindhoven (NL); Jeroen Johannes Theodorus Hendrikus De Best, Druten (NL); Jan Van Eijk, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/129,380

(22) PCT Filed: Apr. 1, 2015

(86) PCT No.: PCT/EP2015/057199
§ 371 (c)(1),
(2) Date: Sep. 26, 2016

(87) PCT Pub. No.: WO2015/150466
PCT Pub. Date: Oct. 8, 2015

(65) Prior Publication Data
US 2017/0212431 A1 Jul. 27, 2017

(30) Foreign Application Priority Data
Apr. 4, 2014 (EP) ..................................... 14163509

(51) Int. Cl.
*G03B 27/68* (2006.01)
*G03F 7/20* (2006.01)

(52) U.S. Cl.
CPC ................................ *G03F 7/70775* (2013.01)

(58) Field of Classification Search
CPC ............. G03F 7/70775; G03F 7/70725; G03F 7/70783; G03F 7/709
See application file for complete search history.

(56) References Cited

U.S. PATENT DOCUMENTS 7,327,437 B2 * 2/2008 Cox .................... G03F 7/70725
250/492.2
8,786,826 B1 7/2014 Bleidistel et al.
(Continued)

FOREIGN PATENT DOCUMENTS

DE   10 2013 201082   3/2014
JP   2014-160241      9/2014
(Continued)

OTHER PUBLICATIONS

International Search Report and Written Opinion dated Oct. 6, 2015 in corresponding International Patent Application No. PCT/EP2015/057199.
(Continued)

*Primary Examiner* — Deoram Persaud
(74) *Attorney, Agent, or Firm* — Pillsbury Winthrop Shaw Pittman LLP (57) ABSTRACT

A control system for a positioning system, for positioning a driven object, e.g. in a lithographic apparatus, in N dimensions has M sensors, where M>N. A transformation module converts the M measurements by the sensors into a positional estimate in N dimensions taking into account compliance of the driven object.

19 Claims, 6 Drawing Sheets

(56) References Cited

U.S. PATENT DOCUMENTS

| | | | | |
|---|---|---|---|---|
| 2002/0118346 | A1* | 8/2002 | Galburt | G03F 7/70833 355/53 |
| 2006/0224655 | A1* | 10/2006 | Shirai | G01S 3/74 708/607 |
| 2008/0018877 | A1* | 1/2008 | Butler | G03F 7/70725 355/72 |
| 2008/0212054 | A1* | 9/2008 | Kamidi | G03F 7/70725 355/53 |
| 2008/0300726 | A1* | 12/2008 | Heiland | G05D 19/02 700/280 |
| 2010/0042666 | A1* | 2/2010 | Park | H04B 7/0413 708/212 |
| 2011/0046795 | A1* | 2/2011 | Fujimoto | F16F 15/002 700/280 |
| 2011/0164230 | A1* | 7/2011 | Ito | G03F 7/70725 355/53 |
| 2012/0127002 | A1* | 5/2012 | Shibahara | H03M 7/30 341/87 |
| 2012/0127003 | A1* | 5/2012 | Shibahara | H04N 19/122 341/87 |
| 2012/0127449 | A1* | 5/2012 | Kamidi | G03F 7/70725 355/72 |
| 2012/0265366 | A1* | 10/2012 | Cahill | G01G 19/086 701/1 |
| 2012/0300188 | A1* | 11/2012 | Butler | G03F 7/70758 355/73 |
| 2013/0194586 | A1* | 8/2013 | Van Eijk | G01B 11/14 356/614 |
| 2013/0278915 | A1* | 10/2013 | Ward | G03F 7/70775 355/72 |
| 2014/0204354 | A1 | 7/2014 | Kwan et al. | |
| 2015/0316860 | A1 | 11/2015 | Van De Wal et al. | |
| 2017/0199468 | A1* | 7/2017 | Butler | G03F 7/70725 |

FOREIGN PATENT DOCUMENTS

| | | |
|---|---|---|
| JP | 2016-503521 | 2/2016 |
| WO | 2013/050081 | 4/2013 |
| WO | 2014/082961 | 6/2014 |

OTHER PUBLICATIONS

S.L.H. Verhoeven, "Robust Control of Flexible Motion Systems: A Literature Study," Philips Applied Technologies, Mechatronics Program, Drives and Control Group and Eindhoven University of Technology, Department of Mechanical Engineering, Dynamics and Control Technology Group, pp. i-90 (Jan. 2009).

Japanese Office Action dated Oct. 10, 2017 in corresponding Japanese Patent Application No. 2016-552283.

* cited by examiner

CONTROL SYSTEM, POSITIONING SYSTEM, LITHOGRAPHIC APPARATUS, CONTROL METHOD, DEVICE MANUFACTURING METHOD AND CONTROL PROGRAM

CROSS-REFERENCE TO RELATED APPLICATIONS

This application is the U.S. national phase entry of PCT patent application no. PCT/EP2015/057199, which was filed on Apr. 1, 2015, which claims the benefit of priority of European patent application no. 14163509.4, which was filed on Apr. 4, 2014, and which is incorporated herein in its entirety by reference.

FIELD

The present invention relates to a control system, a positioning system, e.g. for a lithographic apparatus, a lithographic apparatus, a control program and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

SUMMARY

During operation of a lithographic apparatus, various components must be positioned very accurately, but also moved at high speeds. For example, a patterning device held on a support structure must be positioned accurately in the field of view of a projection system. A substrate, held on a substrate table, must be positioned accurately in the image of the patterning device. More specifically, a target portion of the substrate must be positioned in the correct position to enable correct exposure of the next layer of a device pattern, relative to already exposed and fixed layers. Generally speaking it is not possible to measure directly the position of the target portion on the substrate. It is necessary instead to measure the position of the substrate table and estimate the position of the target portion from the measurement of the position of the substrate table. However, deformation in combination with limited rigidity of the substrate table leads to errors in the estimated position of the target portion. To reduce such errors, the substrate table is designed to be as stiff as possible. Increasing requirements on positioning accuracy require errors in the estimated position to be reduced further. Increasing the stiffness of the substrate table increases the mass and/or size of the substrate table which is undesirable.

It is desirable, for example, to provide an improved arrangement for controlling the position of a component of a lithographic apparatus, for example a substrate, during exposures.

According to an aspect of the invention, there is provided a control system for estimating a position in N dimensions of a point of interest on an object in a lithographic apparatus, where N is a positive integer, the system comprising: a measurement module configured to obtain M measurements, the m measurements relating to one or more measurement points on the object and at least one of the measurement points being displaced from the point of interest, M being a positive integer greater than N; a transformation module configured to convert the M measurements into N positional estimate values representing an estimate of the position in the N dimensions of the point of interest, taking into account only static and low-frequency contributions of non-rigid body modes of the object.

According to an aspect of the invention, there is provided a control method for estimating a position in N dimensions of a point of interest on an object, where N is a positive integer, the method comprising: obtaining M measurements, the measurements relating to one or more measurement points on the object and at least one of the measurement points being displaced from the point of interest, M being a positive integer greater than N; converting the M measurements into N positional estimate values representing an estimate of the position in the N dimensions of the point of interest, taking into account only static and low-frequency contributions of non-rigid body modes of the object.

According to an aspect of the invention, there is provided a control program for estimating the position in N dimensions of a point of interest on an object, where N is a positive integer, the control program comprising code means embodied in tangible form on a computer-readable medium and adapted to instruct a computer to effect the steps of: controlling a measurement systems to obtain M measurements, the positional measurements relating to one or more measurement points on the object and at least one of the measurement points being displaced from the point of interest, M being a positive integer greater than N; converting the M positional measurements into N positional estimate values representing an estimate of the position in the N dimensions of the point of interest, taking into account only static and low-frequency contributions of non-rigid body modes of the object.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
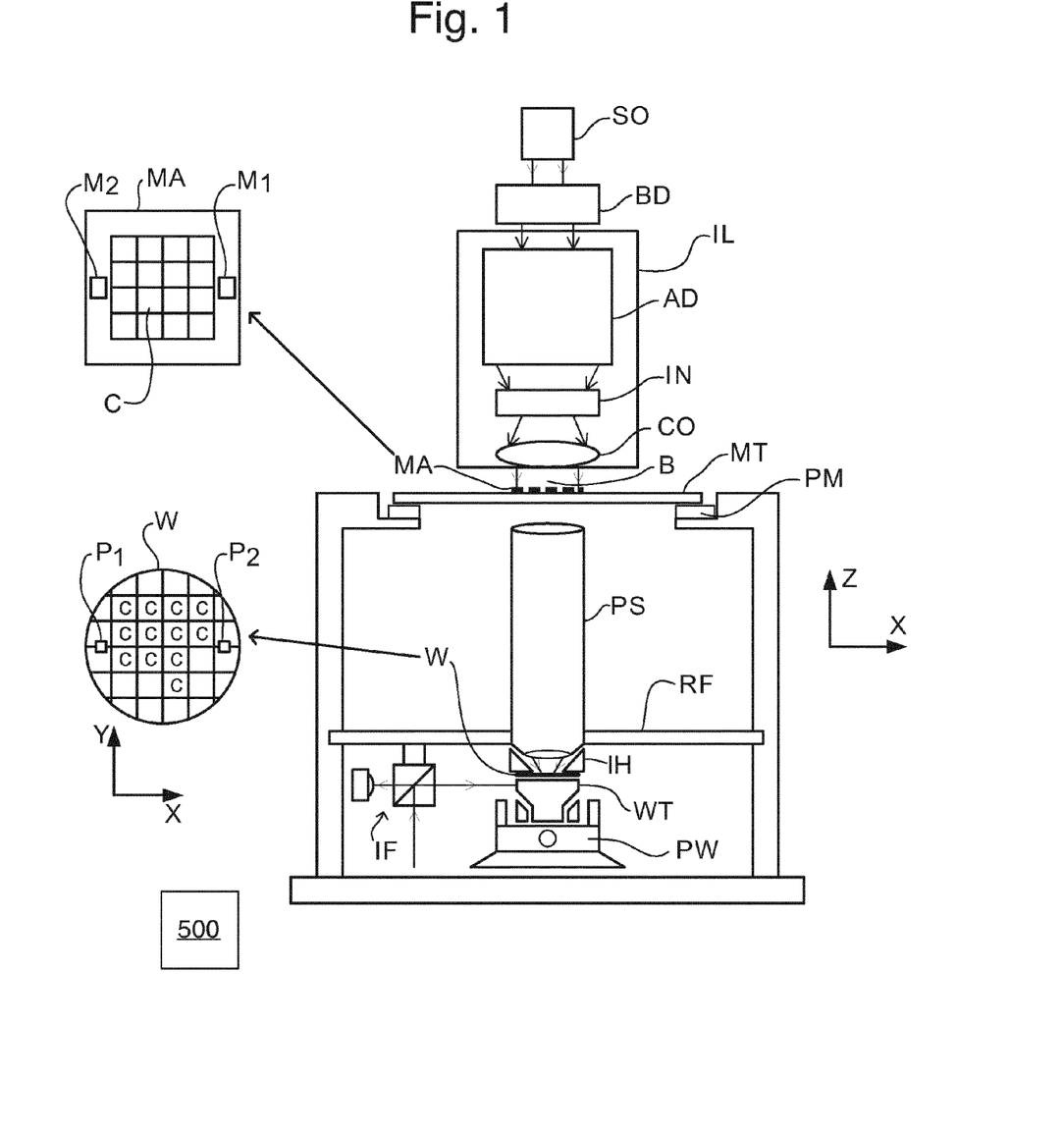
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more substrate tables or a combination of one or more substrate tables and one or more cleaning, sensor or measurement tables. For example, in an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system PS. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In such "multiple stage" (or "multi-stage") machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, cleaning, sensor and/or measurement tables.

In an embodiment, the lithographic apparatus may comprise an encoder system to measure the position, velocity, etc. of a component of the apparatus. In an embodiment, the component comprises a substrate table. In an embodiment, the component comprises a measurement table and/or sensor table and/or cleaning table WT. The encoder system may be in addition to or an alternative to the interferometer system described herein for the tables. The encoder system comprises a sensor, transducer or readhead associated, e.g., paired, with a scale or grid. In an embodiment, the movable component (e.g., the substrate table and/or the measurement table and/or sensor table and/or cleaning table) has one or more scales or grids and a frame of the lithographic apparatus with respect to which the component moves has one or more of sensors, transducers or readheads. The one or more of sensors, transducers or readheads cooperate with the scale(s) or grid(s) to determine the position, velocity, etc. of the component. In an embodiment, a frame of the lithographic apparatus with respect to which a component moves has one or more scales or grids and the movable component (e.g., the substrate table and/or the measurement table and/or sensor table and/or cleaning table) has one or more of sensors, transducers or readheads that cooperate with the scale(s) or grid(s) to determine the position, velocity, etc. of the component.

Referring to FIG. 1, the illuminator IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam is passed from the radiation source SO to the illuminator IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as G-outer and G-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the radiation source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

A liquid can be provided between a final element of the projection system PS and the substrate, e.g. increase the effective NA of the projection system. Any suitable system for providing a liquid can be used, including bath type arrangements, so-called localized immersion systems and all-wet immersion systems. In a bath type arrangement substantially the whole of the substrate W and optionally part of the substrate table WT is submersed in a bath of liquid. A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate Immersion liquid may be supplied to or in the region of a projection system and a facing surface facing the projection system (such a facing surface may be the surface of a substrate and/or a substrate table).

A lithographic apparatus includes various objects that must be positioned with high speed and/or high accuracy. Specific examples of such objects include the substrate table WT and the support structure MT. In a scanning exposure mode, the substrate table WT and support structure WT are scanned in synchronism to perform an exposure. The speed and accuracy of this scanning are central to the performance of the apparatus. A positioning system can be structured as a long stroke module on which a short stroke module is mounted. The long stroke module moves relatively long distances in one or more degrees of freedom with relatively low accuracy. The short stroke module moves shorter distances but with relatively higher accuracy and precision than the long stroke module. In an embodiment, the short stroke module is positionable in more degrees of freedom, for example six degrees of freedom, than the long stroke module. In the description below a Cartesian coordinate system is adopted with orthogonal X, Y and Z axes. In such a coordinate system, the six degrees of freedom of a rigid body can be defined by coordinates x, y, z, $R_X$, $R_Y$ and $R_Z$, where R denotes rotation about the axis indicated by the subscript. Where relevant, the Z axis is conveniently parallel to or coincident with the optical axis of the projection system PS. However the present invention is not specific to a particular coordinate system, origin or orientation of axes. In an embodiment, different coordinate systems can be employed in different parts of the apparatus.

Figure 2:
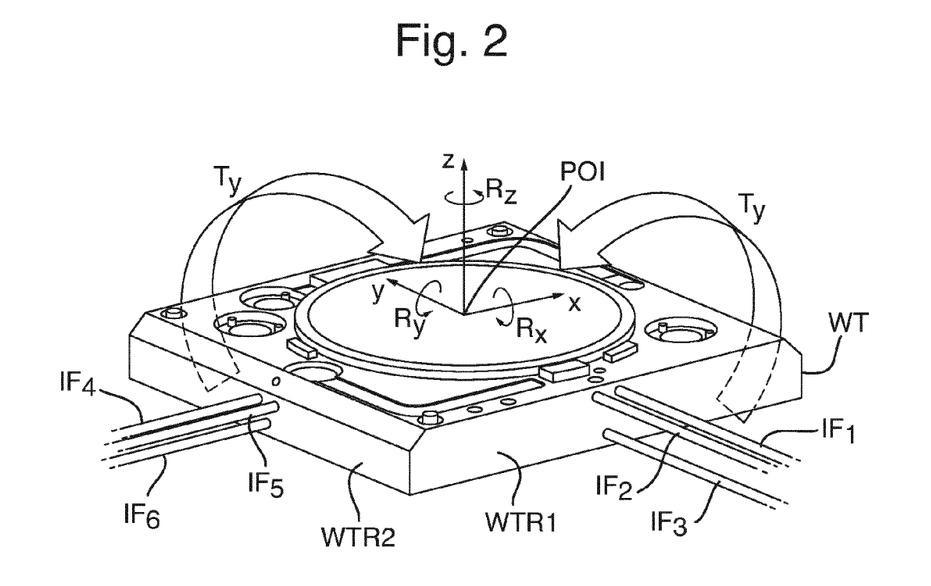
FIG. 2 depicts a substrate table in a lithographic projection apparatus.

The position of an object can be measured using an interferometer system or an encoder or a combination of both. FIG. 2 depicts an interferometer system used for measuring the position of a substrate table WT. Six interferometer beams $IF_1$-$IF_6$ are directed against mirrors WT-R1, WT-R2 provided on two sides of a substrate table WT—three beams per side. A further beam or beams (not shown) directed onto the beveled edge of mirror WT-R2 can also be employed to provide information concerning displacements in the Z directions. The outputs of the interferometer system, and encoder if used, are collectively referred to below as $y_0$. It is desired to know the position and/or orientation of a point of interest POI on the driven object, in this case the substrate W, in one or more of the coordinates x, y, z, $R_X$, $R_Y$ and $R_Z$. The POI can be the position of a target portion C or marker on the substrate W held on the substrate table WT. In such a case, the point of interest POI is not a fixed location on the object, it varies as different target portions are imaged or markers measured. Note that each of the interferometer beams measures the position of a respective location on the object that is not coincident with the point of interest POI.

Figure 3:
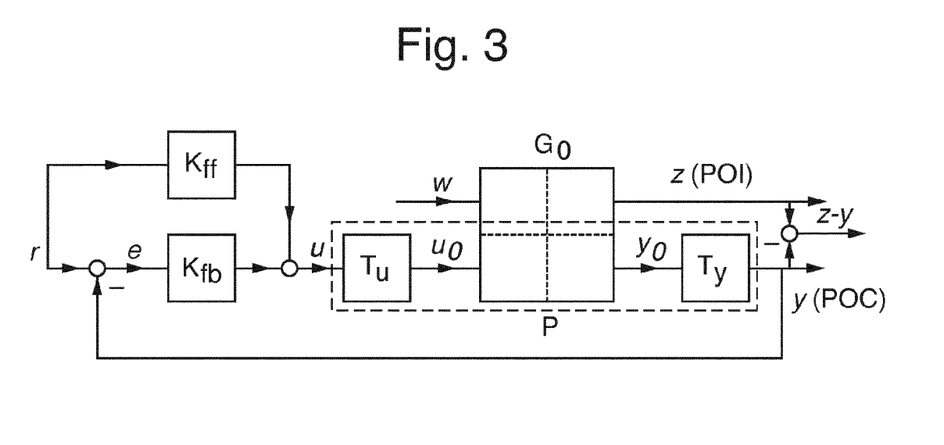
FIG. 3 depicts a control system for a substrate table in a lithographic projection apparatus described for reference.

A typical servo control architecture usable with such an interferometer system is depicted in FIG. 3. The servo control architecture of FIG. 3 can also be used with an encoder-based measurement system or a measurement system that combines interferometer and encoders. In FIG. 3, r represents a desired setpoint, $K_{ff}$ is a feedforward control module for generating a feedforward control signal and $K_{fb}$ is a feedback control module for generating a feedback control system based on a positional error e. The feedforward control signal and feedback control signal are combined into control signal u in nominal coordinates. An actuator transform module $T_u$ converts the control signal u into an actuator control signal $u_0$ to drive actuators included in the physical plant $G_0$, which is also subject to disturbance forces w. The physical plant $G_0$, i.e. the hardware, includes measurement systems with output measurement signals $y_0$. The output measurement signals $y_0$ can be considered as a vector and are input for transformation matrix $T_y$. If it is assumed that the driven object behaves as a rigid body, the transformation matrix $T_y$ merely involves geometric mathematics to calculate the logical coordinates x, y, z, $R_X$, $R_Y$ and $R_Z$, which are referred to as rigid body modes and denoted collectively as vector y. Mathematically, the transformation matrix $T_y$ can be considered as a matrix which is used to multiply vector $y_0$ to generate vector y. Vector y is the best rigid body estimate of the position of the point of interest POI, for example the current target portion C to be exposed, and is referred to as the point of control POC. Vector y is subtracted from the setpoint r to generate error e to close the feedback loop. The point of control POC however may differ from the actual position z of the point of interest POI and the difference (z–y) represents the deformation of the object.

The number of measurement signals, e.g. interferometer beams, can be greater than the number of rigid body modes to be calculated, but if so redundant measurements are averaged to reduce noise and or correct for unflatness in the mirrors WT-R1, WT-R2 so that the number of independent datapoints in $y_0$ is equal to the number of rigid body modes. The vector y can also be used for moving average (MA) and/or moving standard deviation (MSD) servo error calculations.

Through the addition of further measurement sensors, it is possible to provide more output measurement signals in $y_0$ than there are relevant rigid body modes (for example six). This is referred to as over-sensing. Over-sensing can be used to explicitly account for inevitable non-rigid body behavior, i.e. deformation or compliance, of the object. In particular, the over-sensing can be used to compute a transformation matrix $T_y$ that eliminates or reduces the undesired parasitic effect of one or a few non-rigid body modes from the so-called compensated mechanics P, i.e. the combination of $T_y P_0 T_u$ in FIG. 3, to achieve a higher servo bandwidth and in some cases also to achieve better damping of critical non rigid body modes.

Figure 4:
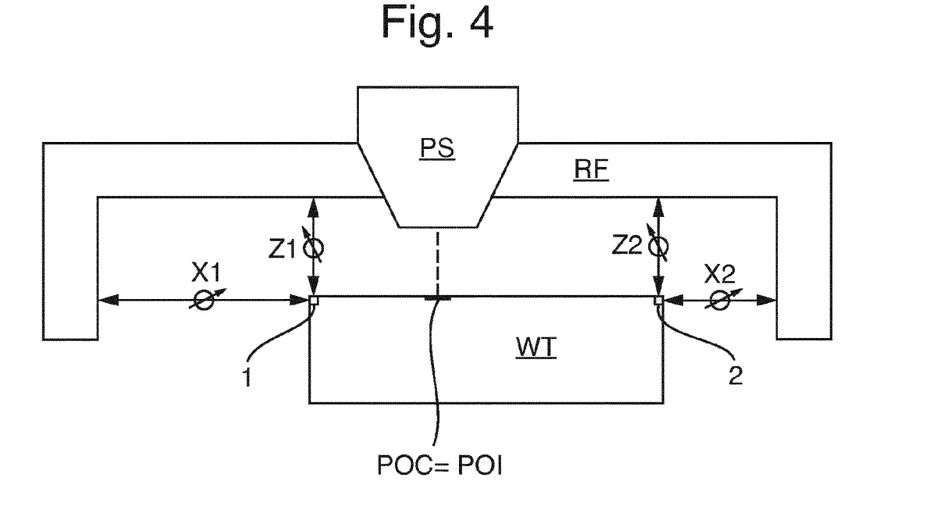
FIG. 4 depicts positioning of a rigid body in a lithographic projection apparatus.
Figure 5:
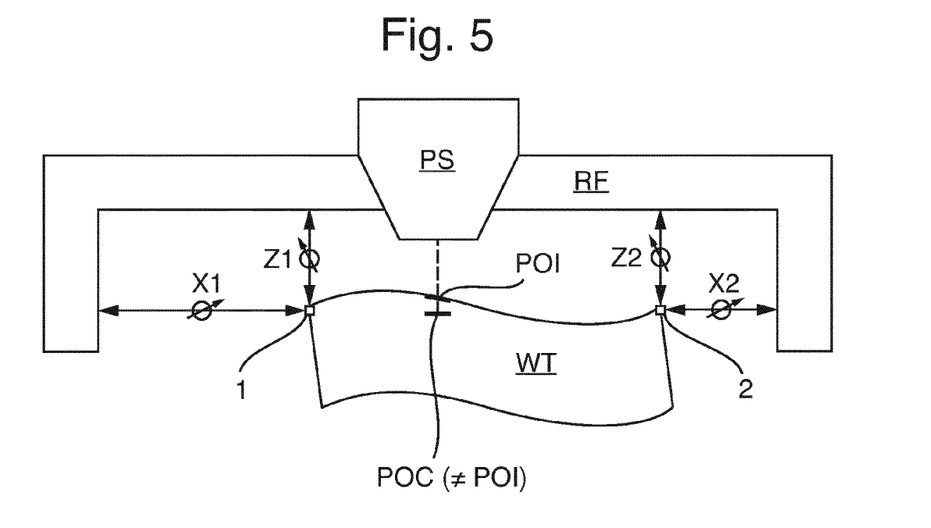
FIG. 5 depicts positioning of a non-rigid body in a lithographic projection apparatus.

With the ever-present desire to reduce the size of features that can be formed with a lithographic apparatus whilst also improving yield and throughput, it is desirable to improve the positioning of objects in a lithographic apparatus. For example, better positioning of an object, such as a substrate table WT or a support structure MT, can reduce overlay. The positioning accuracy of the object can be quantified in terms of the servo error e and the internal deformation of the object (z–y). FIGS. 4 and 5 illustrate the effects of deformation of a substrate table WT on the positioning of a point of interest POI relative to projection system PS. The position of the substrate table is measured relative to reference frame RF using sensors X1, X2, Z1, Z2 and the location of the point of control POC is calculated as discussed above. In the undistorted case, shown in FIG. 4, the point of control POC and the point of interest POI coincide and the substrate table is accurately positioned. However, when the substrate table WT is deformed, as shown in FIG. 5, the point of control POC and the point of interest POI will not coincide, leading to errors in positioning of the substrate table WT. Deformations of the substrate table WT can occur due to both external disturbance forces acting upon the substrate table (e.g., from the liquid supply system, dynamic air pressure forces, cables or hoses attached to the substrate table WT) and internal actuator forces (e.g., actuator forces due to leveling). In some cases, electro-magnetic disturbance forces may cause deformation of the substrate table WT.

To reduce deformation of a driven object, it can be made stiffer, i.e. more rigid. However, in general making an object stiffer increases its mass and/or size. This in turn means that more powerful motors or actuators are required to achieve the same accelerations and/or compensate for gravity so that more deformation is caused. Energy consumption is increased and efficiency reduced. An alternative approach to improving positioning is desirable.

The present inventors have determined that in most cases, the deformation of the driven object, e.g. a substrate table, is determined by compliant dynamic behavior (i.e., "quasi-static" non-rigid body behavior below the resonance frequencies). This is because the relevant disturbance forces have their main spectral content below the resonant behavior of the driven object.

It is an aim of the present invention to reduce the effect of deformation of a driven object though improvements in control. In particular, the present invention proposes to use over-sensing and an advanced transformation module, for transforming sensor measurements into estimates of the position of the point of interest of the driven object. By using additional measurements of deformations of the object, which can be provided by over-sensing, in the computation of an advanced matrix for transforming measurement signals into position estimates, it is possible to provide not only a better rigid body estimate of the position of the driven object, but also an overall improved estimate of the true position of the point of interest. An embodiment of the present invention uses additional sensors in combination with a physical plant model, i.e. a mathematical model of the relevant hardware including the driven object, that includes the relevant non-rigid body phenomena. This model is then used to compute a model-based transformation matrix, T'y, that is provided with more sensor signals in $y_0$ than is conventional. It is an aim of the present invention to make the output of the model-based transformation matrix T'$_y$ a better estimate of the position of the point of interest POI, for example by "cleaning up" the resonance effect of a subset of parasitic non-rigid body modes in the actual measurements $y_0$.

Figure 6:
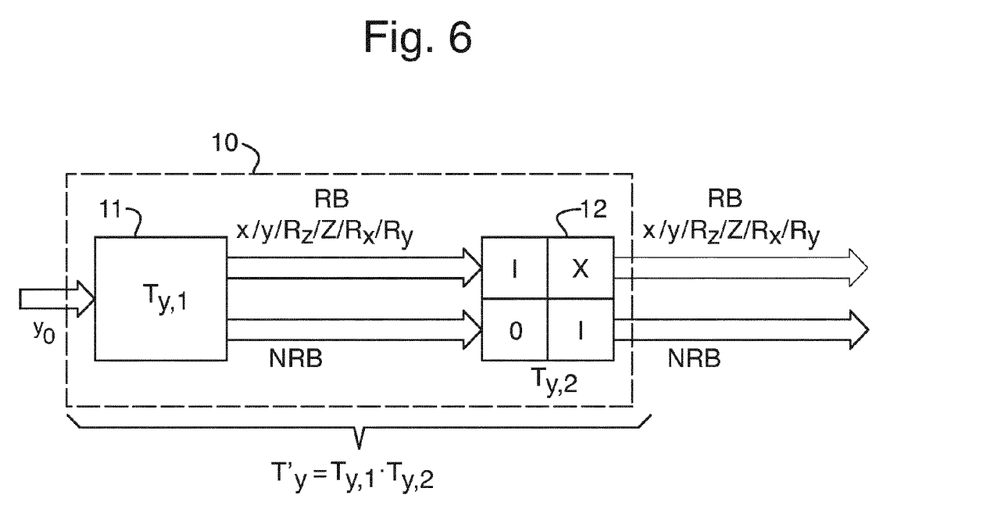
FIG. 6 depicts a part of a control system according to an embodiment of the invention for use in a lithographic projection apparatus.

A part of a control system according to an embodiment of the invention is depicted in FIG. 6. A first transformation module 11 receives sensor measurements $y_0$ and outputs a rigid body estimate of the position of the point of interest in terms of the logical axes x/y/Rz/z/Rx/Ry, possibly with additional non-rigid body coordinates NRB representing some deformation of the driven object. First transformation module 11 can use a first transformation matrix Ty,1 to multiply the sensor signal $y_0$ to generate its output. A second transformation module 12 is provided to suitably combine the rigid body and non-rigid body information output from Ty,1 into a more accurate combined estimate of the position of the point of interest POI in terms of the logical axes x/y/Rz/z/Rx/Ry. This combination can also be done using a second transformation matrix Ty,2. In an embodiment, the first and second transformation matrices are combined in T'y=Ty,1·Ty,2. The matrix T'y is used by a combined transformation module 10.

In an embodiment, the second transformation matrix Ty,2 has a particular form. It is a triangular matrix, specifically an upper triangular matrix, meaning that all values below the main diagonal are zero. In an embodiment, the second transformation matrix Ty,2 can be divided into four quarters. The quarters on the main diagonal are unit matrices. The quarter below the main diagonal is all zero values. The quarter above the main diagonal has values determined as discussed below. It will be appreciated that the form of the matrix depends on the order of sensor measurements in the input vector $y_0$ and the order of position estimates in the output vector. The described structure assumes the rigid body coordinates in logical axes x/y/Rz/z/Rx/Ry are first in the output vector. Any matrix which has the specified structure when rearranged to output logical axes x/y/Rz/z/Rx/Ry first in the output vector, should be regarded as having the specified structure.

The basic principles for calculating the model-based transformation matrix T'y are explained below, assuming that the physical plant $G_0$ in FIG. 3 represents a mechanical structure that can be appropriately represented by a linear modal state-space description as follows:

$$G_0 : x := \begin{bmatrix} q \\ \dot{q} \end{bmatrix}, \dot{x} = Ax + \begin{bmatrix} 0 \\ B_w \end{bmatrix} w + \begin{bmatrix} 0 \\ B_{u0} \end{bmatrix} u_0, \quad (1)$$

$$z = [\, C_z \;\; 0 \,] x, \; y_0 = [\, C_{y0} \;\; 0 \,] x.$$

Here, q are the so-called modal coordinates and the other symbols w, u, z, and y have the same meaning as in FIG. 3, where $y_0$ represents the sensor signals and z represents the displacements of the point of interest POI. The length of the various vectors will be denoted by "n", for instance, nq is the number of entries in q. Given the above formulas, the position of the point of interest POI denoted by z could be obtained from the measurements $y_0$ by the following relation:

$$z = \underbrace{C_z \cdot C_{y0}^{-1}}_{T'_y} \cdot y_0. \quad (2)$$

In this way, a theoretical expression for the model-based transformation matrix T'y is obtained that would render the output of T'y to be the actual position of the point of interest POI. This is not always of practical use, since $C_{y0}$ is generally a "fat" matrix (i.e. wider than it is tall), because generally nq>>ny0, and hence the matrix cannot be inverted straightforwardly.

In an embodiment of the invention, a rigorous model reduction is performed to reduce the value of nz. This is done by so-called residualization, where only the static contribution of all non-rigid body modes is kept in an additional matrix referred to as the D-matrix. For this purpose, first a clear distinction is made between the rigid body coordinates contained in $q_{RB}$ in q and the non-rigid body coordinates contained in $q_{NRB}$, by rewriting equation (1) as follows (note that the ordering of the modal coordinates in x is now different):

$$x := \begin{bmatrix} x_{RB} \\ x_{NRB} \end{bmatrix}, x_{RB} = \begin{bmatrix} q_{RB} \\ \dot{q}_{RB} \end{bmatrix}, x_{NRB} = \begin{bmatrix} q_{NRB} \\ \dot{q}_{NRB} \end{bmatrix} \quad (3)$$

$$G_0 : \begin{cases} \begin{bmatrix} \dot{x}_{RB} \\ \dot{x}_{NRB} \end{bmatrix} = \begin{bmatrix} A_{RB} & 0 \\ 0 & A_{NRB} \end{bmatrix} \begin{bmatrix} x_{RB} \\ x_{NRB} \end{bmatrix} + \begin{bmatrix} B_w^{RB} \\ B_w^{NRB} \end{bmatrix} w + \begin{bmatrix} B_{u0}^{RB} \\ B_{u0}^{NRB} \end{bmatrix} u_0, \\ z = [\, C_z^{RB} \;\; C_z^{NRB} \,] \begin{bmatrix} x_{RB} \\ x_{NRB} \end{bmatrix}, \\ y_0 = [\, C_{y0}^{RB} \;\; C_{y0}^{NRB} \,] \begin{bmatrix} x_{RB} \\ x_{NRB} \end{bmatrix} \end{cases}$$

The key idea of model reduction by residualization is now to eliminate the non-rigid body modes contained in $x_{NRB}$ by setting the differential equation related to $x_{NRB}$ equal to zero (which basically amounts to considering the steady-state solution only) and solving $x_{NRB}$ from the resulting algebraic relation as follows:

$$\dot{x}_{NRB} = 0 \Rightarrow 0 = A_{NRB} x_{NRB} + B_w^{NRB} w + B_{u0}^{NRB} u_0 \Leftrightarrow x_{NRB} = \quad (4)$$
$$- A_{NRB}^{-1} [\, B_w^{NRB} \;\; B_{u0}^{NRB} \,] \begin{bmatrix} w \\ u_0 \end{bmatrix}.$$

Note that the matrix $A_{NRB}$ is square and invertible by definition of the modal system dynamics Substituting this expression in equation (3) gives the following reduced-order physical plant model $G_{0,red}$:

$$G_{0,red}: \dot{x}_{RB} = A_{RB}x_{RB} + \underbrace{[B_w^{RB} \quad B_{u0}^{RB}]}_{:=B_{RB}}\begin{bmatrix} w \\ u_0 \end{bmatrix}, \quad (5)$$

$$\begin{bmatrix} z \\ y_0 \end{bmatrix} = \underbrace{\begin{bmatrix} C_z^{RB} \\ C_{y0}^{RB} \end{bmatrix}}_{:=C_{RB}} x_{RB} + \underbrace{\begin{bmatrix} -C_z^{NRB}A_{NRB}^{-1}B_w^{NRB} & -C_z^{NRB}A_{NRB}^{-1}B_{u0}^{NRB} \\ -C_{y0}^{NRB}A_{NRB}^{-1}B_w^{NRB} & -C_{y0}^{NRB}A_{NRB}^{-1}B_{u0}^{NRB} \end{bmatrix}}_{:=D}\begin{bmatrix} w \\ u_0 \end{bmatrix}$$

By the specific nature of the modal physics, the last half of the columns in the matrices in $C_{RB}$ is equal to zero (see also equation (1)) and with a more compact notation of the entries in the D-matrix, equation (5) can be rewritten as follows:

$$G_{0,red}: \dot{x}_{RB} = A_{RB}x_{RB} + B_{RB}\begin{bmatrix} w \\ u_0 \end{bmatrix}, \quad (6)$$

$$\begin{bmatrix} z \\ y_0 \end{bmatrix} = \begin{bmatrix} C_{z,1}^{RB} & 0 \\ C_{y0,1}^{RB} & 0 \end{bmatrix}\begin{bmatrix} q_{RB} \\ \dot{q}_{RB} \end{bmatrix} + \begin{bmatrix} D_z \\ D_{y0} \end{bmatrix}\begin{bmatrix} w \\ u_0 \end{bmatrix}$$

An expression for the model-based transformation matrix T'y that constructs z from the sensor information in $y_0$ can then be derived as follows:

$$T'_y = \underbrace{[C_{z,1}^{RB} \quad D_z]}_{n_z \times (n_{q_{RB}} + n_w + n_{u0})} \cdot \underbrace{[C_{y0,1}^{RB} \quad D_{y0}]^{-1}}_{n_{y0} \times (n_{q_{RB}} + n_w + n_{u0})}. \quad (7)$$

This model-based transformation matrix T'y would make the output y (POC) to be an improved estimate of the position of the actual point of interest POI, because the compliance of the non-rigid body modes is taken into account. Although y is not equal to the true z, because information of the resonance dynamics of the non-rigid body modes is lost in the model reduction by residualization, it is still a substantial improvement. Though the matrix to be inverted is still not square, it is generally a considerably less fat matrix than the original one $C_{y0}$. To make it square and exactly invertible, the number of sensors $ny_0$ needs to be equal to ($nq_{RB}$+nw+nu0), i.e., equal to the sum of the rigid body modes $nq_{RB}$ (i.e. the number of dimensions in which the object is to be positioned) plus the number of external disturbance loads nw plus the number of actuator forces nu0. In an embodiment of the invention the sensors used can include interferometers, 2-dimensional encoders, 3-dimensional encoders, or strain sensors (e.g., Fiber Bragg Gratings or piezo-electric strain sensors).

In an embodiment of the invention, the non-residualised modes $q_{RB}$ can include one or more non-rigid body modes, for example a torsion mode, in place of or in addition to the rigid body modes.

In an embodiment of the invention, actuator signals $u_0$ are also input to the first transformation module 11 and the model-based transformation matrix T'y is modified accordingly. This reduces the required number of sensors by $nu_0$ to ($nq_{RB}$+nw).

In an embodiment of the invention, the transformation matrix is calculated using an approximate inversion instead of exact invertibility. The Singular Value Decomposition (SVD) of the matrix-to-be-inverted is computed and only the information associated with the largest singular values is used. This approach can substantially reduce the total number of sensors required.

In an embodiment of the invention a feedback controller is used that is able to make $q_{RB}$=0 (instead of $q_{RB}$≈0). It is then possible to eliminate either $u_0$ or w from the equations, reducing the required number of sensors by $nu_0$ or nw, also if only $y_0$ is provided as input to T'y.

Next, simulation and experimental results obtained from an experiment using an over-sensed test object will be described. The experiment was restricted to the vertical plane, where the test object has considerable compliance. For reference, its torsion mode is at about 160 [Hz]. Multiple (small) actuators are mounted at the bottom of the test object, with the four closest to the corners being used for servo actuation. The other vertical actuators can be used to mimic a vertical disturbance force, e.g., due to liquid supply system. Four encoders are provided at the corners of the test object. Strain sensors are also provided: both piezoelectric sensors in pocket holes at the bottom of the test object and fiber-Bragg grating sensors at the top of the test object. As inputs to the transformation module used in the experiment, the four vertical encoder signals are used in combination with either four fiber-Bragg grating sensors or three piezoelectric sensors. The test object was also provided with an additional sensor that can measure the true displacement of the actual POI in the vertical direction.

Figure 7:
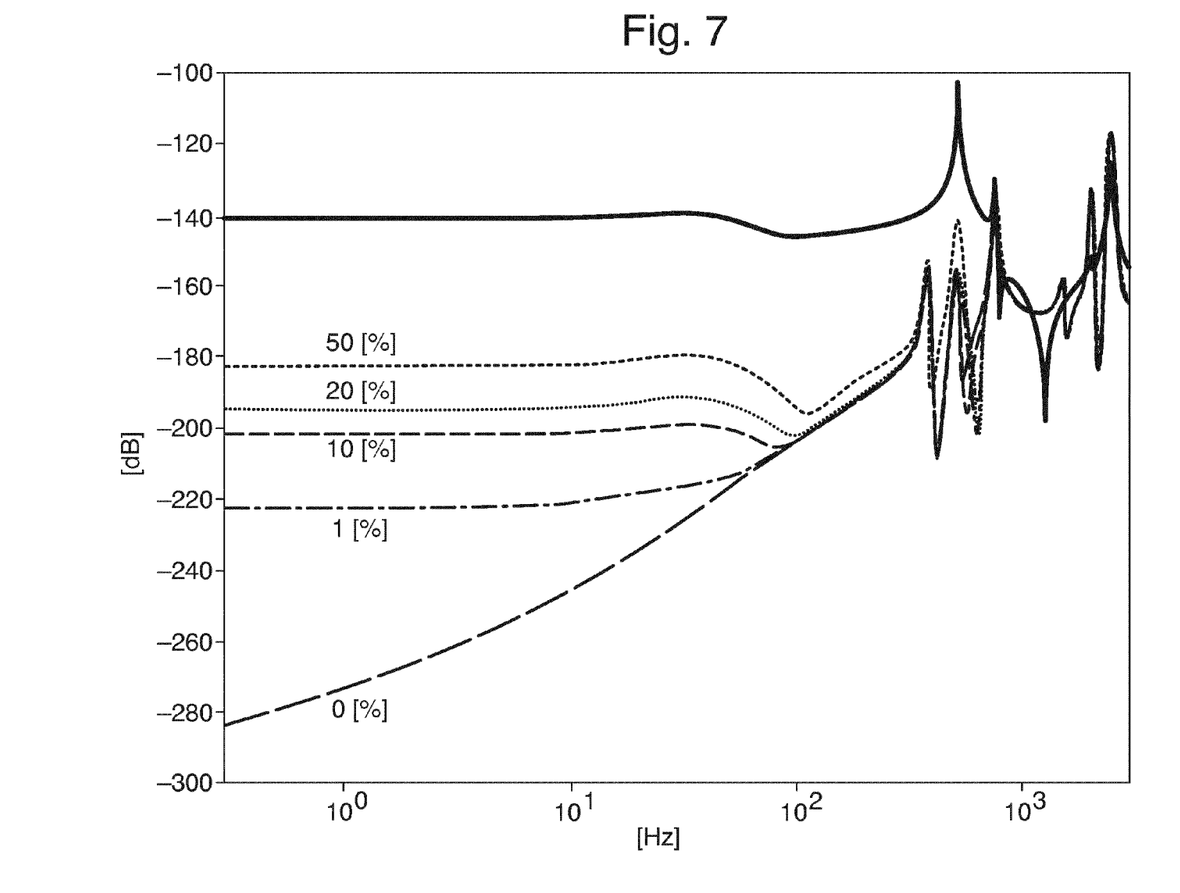
FIGS. 7 and 8 are Bode plots of a control system according to an embodiment of the invention.

FIG. 7 is a Bode magnitude plot showing the result of a simulation example based on a finite element model of the test object. Specifically it is a Bode plot of the closed-loop transfer function from vertical force disturbance to internal deformation of the test driven object for the z-direction. The different lines indicate different simulations as follows: a conventional T'y and no oversensing is shown as a solid line; and a model-based transformation matrix T'y according to the invention is shown by dashed lines. The different dashed lines relate to different levels of parameter uncertainties in the compliance matrix D in equation (5): 0 [%] (very long dashes), 1 [%] (long and short dashes), 10 [%] (long dashes), 20 [%] (dots), and 50 [%] (short dashes).

The solid line, relating to use of a transformation matrix without taking account of compliance of the test object, clearly shows a horizontal line up to about 100 [Hz], due to the fact that the test object's compliance is not taken into account in the estimation of the point of control POC. The very long dashed line shows that this compliance effect completely disappears when a transformation matrix T'y in accordance with the invention is used in combination with four fiber-Bragg Grating strain sensors. Where the compliance of the driven object is known exactly, the error in the point of control POC due to the compliance is hugely reduced below the resonance frequencies. The other dashed lines show the results if the compliance matrix D in G0, in equation (5) above, is uncertain or not known exactly. FIG. 7 shows that even in case of 50 [%] parameter uncertainty the error in the point of control POC up to 100 [Hz] is still reduced by 40 [dB], i.e., a factor 100 for this specific example. The actual reduction achievable in practice depends on the specific case, but substantial improvement can be achieved using the invention even where there is considerable uncertainty about the compliant behavior of the driven object.

Figure 8:
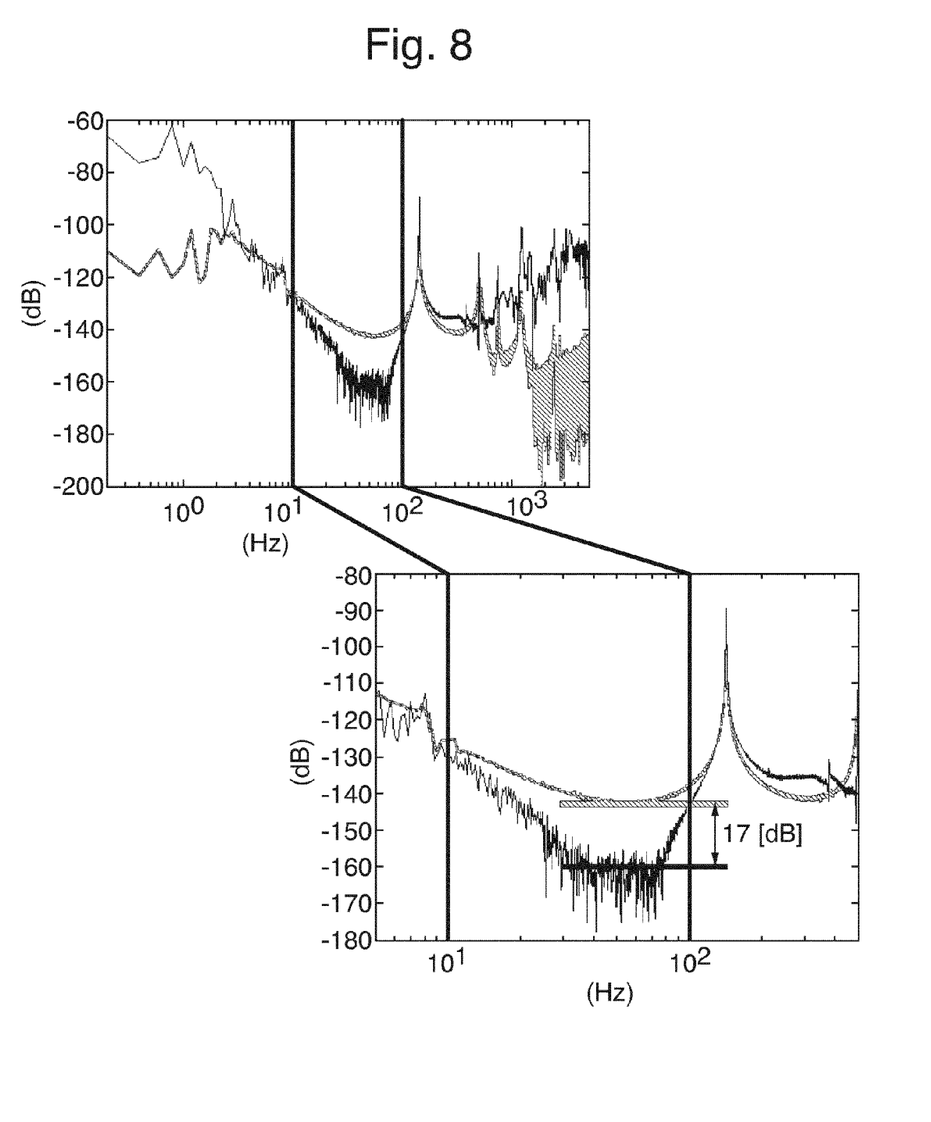

FIG. 8 is a Bode plot showing the closed-loop transfer function from a simulated disturbance force (w in FIG. 3) representing the effect of a liquid supply system to the internal deformation of the test object for the z-direction (z-y in FIG. 3), using feedback controllers with a relatively low bandwidth of 50 [Hz]. In this test, three piezoelectric sensors are used to provide oversensing, rather than fiber-Bragg grating sensors as in the simulation of FIG. 7. Also FIG. 8 shows the open-loop transfer function (i.e. without a feedback controller or, equivalently, 0 [Hz] bandwidth) between disturbance force w and the error (z-y) in the position of the point of control POC for the vertical direction. FIG. 8 therefore also shows a measure for internal deformation of the test object, where the thinner line using over-sensing and a model-based transformation matrix T'y according to the invention is clearly smaller in the main frequency range of interest 10-100 [Hz] than the thick line for a transformation matrix Ty without over-sensing and not taking into account compliance of the test object.

Figure 9:
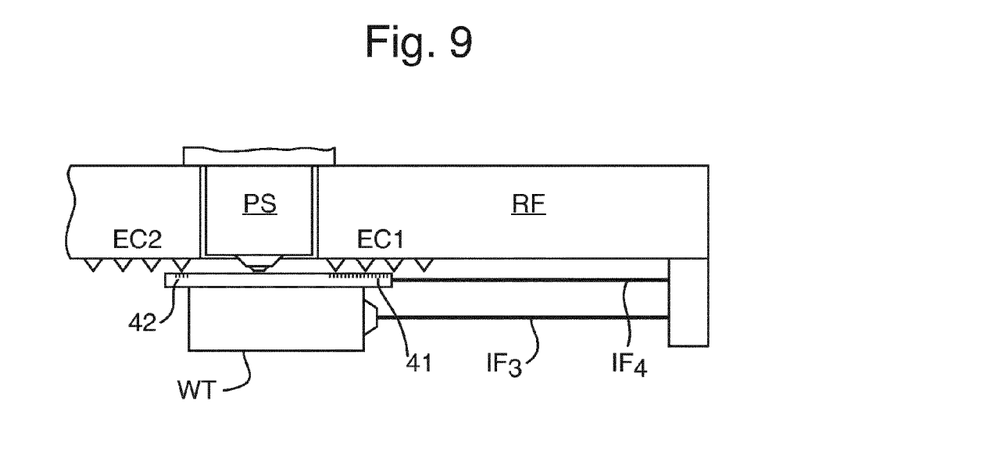
FIG. 9 depicts position and displacement measuring systems for a substrate table of a lithographic apparatus according to an embodiment of the invention.

FIG. 9 depicts schematically an arrangement of sensors usable with an embodiment of the invention. In the arrangement of FIG. 9, the driven object is a substrate table WT. It is provided with both interferometric measurement systems IFA, IFB as well as encoder-based measurement systems EC1, EC2. Encoder-based measurement systems EC1, EC2 each comprise a plurality of readheads, e.g. 4 readheads, mounted on a reference frame RF. The reference frame RF is configured to be positionally stable and isolated from the surroundings to provide a position reference for the apparatus. The projection system PS is mounted in fixed, known relationship with the reference frame RF. The readheads of encoder-based measurement systems EC1, EC2 are arranged to interact with grids 41, 42 mounted on substrate table WT to measure displacements thereof in one or more dimensions. Grids 41, 42 can be one dimensional, e.g. linear gratings, or two-dimensional. Grids 41, 42 can be provided at one, two, three or four sides of the substrate (not shown in FIG. 9), which is supported by the substrate table WT. Each readhead can be configured to output a position signal in one or more dimensions, e.g. two or three dimensions. In an embodiment of the invention, any convenient combination of interferometric and/or encoder based position sensors can be used to measure displacements and/or internal deformation of the driven object. Encoder-based systems can be configured with encoder readheads mounted on the driven object and grids provided on a fixed reference or vice versa.

An alternative approach to derive the model-based transformation matrix T'y will now be described. In this approach, the computation of T'y is performed in a somewhat different manner, involving lowpass filtering of the D-matrix in equation (5), and possibly more clearly illustrating the additional transformation taught by the present invention. In this embodiment, the actuator transformation, represented by Tu in FIG. 3 is replaced by three matrices: Tu,1, Tu,2 and Tu,3. Likewise, the transformation matrix, Ty in FIG. 3 is replaced by three matrices Ty,1, Ty,2 and Ty,3. The combination of Ty,1 and Ty,2 in the discussion below corresponds to Ty,1 in the explanation above.

First, Ty,1 is computed. Ty,1 is a first transformation matrix that transforms the measured variables in $y_0$ into the relevant modal displacements denoted by $y_{q0}$. Besides the rigid body modes, $y_{q0}$ may also contain fictitious compliance or fictitious non-rigid body modes which will be explained in more detail below. A similar step is taken in Tu,1 on the input side.

Second, second transformation matrix Ty,2 is computed to align the rigid body modes to the coordinate system used in the relevant part of the apparatus, since their original alignment in $y_{q0}$ may be quite arbitrary and is often along the principal axis of inertia. Therefore, Ty,2 is a block-diagonal matrix where the upper left part is potentially a completely filled matrix related to the rigid body modes and the lower right part is an identity matrix related to the non-rigid body modes to be decoupled. The output of Ty,2 is denoted by $y_q$, the aligned version of the input variables of Ty,2 in $y_{q0}$. Tu,2 is the inverse of Ty,2.

Third, Tu,3 is used to scale the mass and inertia of the rigid body modes to their expected values. Third transformation matrix Ty,3 is initially set to identity and introduced here to maintain duality between the input and output side of the physical plant $G_0$.

The overall decoupling matrices are Ty:=Ty,3·Ty,2·Ty,1 and Tu:=Tu,3·Tu,2·Tu,1 and the part of the physical plant $G_0$ that is directly in the feedback loop, i.e., $P_0$ in FIG. 3 is now decoupled in terms of its relevant modes that have been used in the computation of Ty and Tu. However, inevitably some coupling remains due to the non-addressed (parasitic) modes. The overall compensated plant in the feedback loop is P:=Ty·$P_0$·Tu and this compensated plant P is approximately decoupled.

By using over-sensing and the Ty as derived above, the rigid body-related variables in y are already an improved estimate of the rigid body behavior at the true point of interest POI, compared to the case without over-sensing. The invention proposes to transform the rigid body-related variables in $y_q$ (denoted by $y_{q,RB}$ in Equation (5)) into an improved estimate of the position of the point of interest, POI by also using information contained in the non-rigid body-related variables in $y_q$ (denoted by $y_{q,NRB}$ in Equation (5)). This amounts to using an upper triangular matrix Ty,3, where the freedom in the block "X" can be used for this improvement:

$$\begin{bmatrix} z_{est} \\ y_{q,NRB} \end{bmatrix} = \begin{bmatrix} I & X \\ 0 & I \end{bmatrix} \begin{bmatrix} y_{q,RB} \\ y_{q,NRB} \end{bmatrix} \qquad (8)$$

Note that Tu,3 is not modified along with Ty,3, causing a degradation of the decoupling of the overall compensated plant P in terms of the rigid body modes contained in $y_{q,RB}$. Ty,3 can be computed based on a formula of the following form:

$$T_y = C_z \cdot (C_{y,0})^{-1} \qquad (9)$$

where $C_z$ is the C-matrix of $G_0$ related to the point of interest variables in z, and $C_{y,0}$ is the C-matrix related to the modal displacements in $y_q$. So, $C_{y,0}$ already includes the effect of Ty,1 and Ty,2. Moreover, $C_{y,0}$ is square, since the number of relevant modes in $y_q$ is the same as the number of variables in q after residualization.

Next, it is discussed how T'y for information on $y_0$ only can be computed:

1. Start with the state-space representation of $G_0$ and decide on the main modes to be controlled and contained in $q_{RB}$ (besides the rigid body modes, this could be some non-rigid body modes, like the torsion mode) and the modes to be residualized contained in $q_{NRB}$.

2. Choose the appropriate number of sensors in $y_0$ that equals ny0=$nq_{RB}$+nw+nu0 in this case.

3. Perform residualization to create the D-matrix related to w and $u_0$.

4. Make a Singular Value Decomposition of the D-matrix D=UΣ$V^T$, with Σ a diagonal matrix containing the singular values and U and V matrices containing the left and right singular vectors. On the shortest side of Σ, multiply the matrix Σ by a diagonal concatenation of the same second order lowpass filter with under-critical damping (as for mechanical modes in a lightly damped model system). This results in a new state-space description where the D-matrix is again zero (as in usual modal descriptions like equation (1)) and where additional fictitious non-rigid body modes "$q_{FNRB}$" are created due to lowpass filtering of the RB modes (the number of fictitious non-rigid body modes $n_{qFNRB}$=rand(D)). The resulting matrix $C_y^*$ should be square and invertible, assuming a sensible sensor placement. In an embodiment it is initially investigated which modes have the largest compliance contribution to the total compliance and e.g. piezo strain sensors are placed in such a way that these modes show a large amplitude on the piezo strain sensors (i.e., enabling a good signal to noise ratio for these sensors). If $n_{y0}$ is smaller or larger than $n_{qRB}$+nw+nu0, $C_y^*$ is called fat or tall, respectively.

5. Solve the "modal displacements" in $[q_{RB}; q_{FNRB}]$ from $y0=C_y^* \cdot [q_{RB}; q_{FNRB}]$. This implies computing $T_{y,1}$ according to the modal decoupling approach, with $T_{y,1}$ the regular inverse or the pseudo-inverse of $C_y^*$.

6. Compute $T_{y,2}$ according to the rigid body alignment approach. The resulting C-matrix at this stage is $C_y^{**} = T_{y,2} \cdot T_{y,1} \cdot C_y^*$ and this matrix is square. If $ny0 \geq n_{qRB}$+nw+nu0, the matrix product $T_{y,1} \cdot C_y^* = I$. Also, if $ny0 < n_{qRB}$+nw+nu0, then $T_{y,1} = C_y^* \neq I$, due to the lack of sensors.

7. $T_{y,3}$ can be computed by using the inverse of $C_y^{**}$:

$$T_{y,3} = C_Z^* \cdot (T_{y,2} \cdot T_{y,1} \cdot C_y^*)^{-1} \qquad (10)$$

As will be appreciated, any of the above described features can be used with any other feature and it is not only those combinations explicitly described which are covered in this application.

Embodiments of the invention may take the form of a computer program containing one or more sequences of machine-readable instructions for causing a computer system to perform a method as disclosed above, or a tangible data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Furthermore, although the invention has been described above in the context of an immersion lithographic apparatus for convenience, it will be appreciated that the invention may be used in conjunction with any form of lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

The descriptions above are intended to be illustrative, not limiting. Thus, it will be apparent to one skilled in the art that modifications may be made to the invention as described without departing from the scope of the claims set out below.

The invention claimed is:

1. A control system configured to estimate a position in N dimensions of a point of interest on an object in a lithographic apparatus, where N is a positive integer, the system comprising:
   a measurement module configured to obtain M measurements, the M measurements relating to one or more measurement points on the object and at least one of the measurement points being displaced from the point of interest, M being a positive integer greater than N; and
   a transformation module configured to convert the M measurements into N positional estimate values representing an estimate of the position in the N dimensions of the point of interest, taking into account only static and low-frequency contributions of non-rigid body modes of the object.

2. A control system according to claim 1, wherein the measurement module is configured so that M is equal to or greater than the sum of: N, the number of external disturbance loads on the object and the number of actuator forces applied to the object.

3. A control system according to claim 1, wherein the transformation module comprises:
   a first transformation matrix configured to transform the M measurements into N preliminary positional estimate values representing an estimate of the position of the point of interest in the N dimensions assuming the object is a rigid body and (M−N) deformation values representing deformation of the object; and
   a second transformation matrix configured to transform the N preliminary positional estimate values and the (M−N) deformation values into the N positional estimate values.

4. A control system according to claim 1, wherein the transformation module comprises a combined transformation matrix equivalent to the product of:
   a first transformation matrix configured to transform the M measurements into N preliminary positional estimate values representing an estimate of the position of the point of interest in the N dimensions assuming the object is a rigid body and (M−N) deformation values representing deformation of the object; and
   a second transformation matrix configured to transform the N preliminary positional estimate values and the (M−N) deformation values into the N positional estimate values.

5. A control system according to claim 3, wherein the second transformation matrix is a triangular matrix.

6. A control system according to claim 1, wherein the measurement module comprises a plurality of sensors selected from position sensors, displacement sensors, velocity sensors, accelerometers, and/or strain sensors.

7. A control system according to claim 1, wherein the measurement module comprises a plurality of sensors selected from: interferometers, encoders, air gauges, fiber Bragg grating sensors and/or piezoelectric sensors.

8. A positioning system configured to position an object, the positioning system comprising:

a control system according to claim 1; and an actuation system configured to displace the object in at least the N dimensions.

9. A positioning system according to claim 8, wherein the control system is configured to generate actuator signals to control the actuator system and the transformation module is further configured to use the actuator signals to convert the M measurements into N positional estimate values.

10. A lithographic apparatus comprising a positioning system according to claim 8, wherein the object is a: a substrate table of the lithographic apparatus, a measurement table of the lithographic apparatus, a cleaning table of the lithographic apparatus, a support structure, of the lithographic apparatus, for a patterning device; or an optical element of the lithographic apparatus.

11. A control method for estimating a position in N dimensions of a point of interest on an object, where N is a positive integer, the method comprising:

obtaining M measurements, the M measurements relating to one or more measurement points on the object and at least one of the measurement points being displaced from the point of interest, M being a positive integer greater than N; and converting the M measurements into N positional estimate values representing an estimate of the position in the N dimensions of the point of interest, taking into account only static and low-frequency contributions of non-rigid body modes of the object.

12. A device manufacturing method using a lithographic apparatus including a movable component, wherein the position of the movable component is estimated using the method of claim 11.

13. A control method according to claim 11, wherein the M measurements are made using a plurality of sensors selected from: position sensors, displacement sensors, velocity sensors, accelerometers, and/or strain sensors.

14. A control method according to claim 11, wherein the M measurement are made using a plurality of sensors selected from: interferometers, encoders, air gauges, fiber Bragg grating sensors and/or piezoelectric sensors.

15. A non-transitory computer-readable medium comprising a control program for estimating a position in N dimensions of a point of interest on an object, where N is a positive integer, the control program comprising code configured to instruct a computer to effect at least:

control of a measurement system to obtain M measurements, the positional measurements relating to one or more measurement points on the object and at least one of the measurement points being displaced from the point of interest, M being a positive integer greater than N; and conversion of the M positional measurements into N positional estimate values representing an estimate of the position in the N dimensions of the point of interest, taking into account only static and low-frequency contributions of non-rigid body modes of the object.

16. A control method according to claim 11, wherein M is equal to or greater than the sum of: N, the number of external disturbance loads on the object and the number of actuator forces applied to the object.

17. A control method according to claim 11, wherein converting comprises:

using a first transformation matrix to transform the M measurements into N preliminary positional estimate values representing an estimate of the position of the point of interest in the N dimensions assuming the object is a rigid body and (M−N) deformation values representing deformation of the object; and using a second transformation matrix to transform the N preliminary positional estimate values and the (M−N) deformation values into the N positional estimate values.

18. A control method according to claim 17, wherein the second transformation matrix is a triangular matrix.

19. A control method according to claim 11, wherein the converting comprises using a combined transformation matrix equivalent to the product of:

a first transformation matrix configured to transform the M measurements into N preliminary positional estimate values representing an estimate of the position of the point of interest in the N dimensions assuming the object is a rigid body and (M−N) deformation values representing deformation of the object; and a second transformation matrix configured to transform the N preliminary positional estimate values and the (M−N) deformation values into the N positional estimate values.

* * * * *